United States Patent
Yokosuka et al.

(10) Patent No.: US 11,443,914 B2
(45) Date of Patent: Sep. 13, 2022

(54) CHARGED-PARTICLE BEAM DEVICE AND CROSS-SECTIONAL SHAPE ESTIMATION PROGRAM

(71) Applicant: Hitachi High-Tech Corporation, Tokyo (JP)

(72) Inventors: Toshiyuki Yokosuka, Tokyo (JP); Hajime Kawano, Tokyo (JP); Kouichi Kurosawa, Tokyo (JP); Hideyuki Kazumi, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 16/967,989

(22) PCT Filed: Dec. 18, 2018

(86) PCT No.: PCT/JP2018/046658
§ 371 (c)(1),
(2) Date: Aug. 6, 2020

(87) PCT Pub. No.: WO2019/176212
PCT Pub. Date: Sep. 19, 2019

(65) Prior Publication Data
US 2021/0366685 A1   Nov. 25, 2021

(30) Foreign Application Priority Data

Mar. 14, 2018 (JP) .............................. JP2018-046214

(51) Int. Cl.
*H01J 37/05* (2006.01)
*H01J 37/22* (2006.01)
*H01J 37/28* (2006.01)

(52) U.S. Cl.
CPC ............. *H01J 37/222* (2013.01); *H01J 37/05* (2013.01); *H01J 37/28* (2013.01); *H01J 2237/2803* (2013.01)

(58) Field of Classification Search
CPC .......... H01J 37/222; H01J 37/05; H01J 37/28; H01J 2237/2803; H01J 37/22;
(Continued)

(56) References Cited

U.S. PATENT DOCUMENTS 5,412,210 A     5/1995 Todokoro et al.
11,133,147 B2 *  9/2021 Yokosuka ............. H01J 37/244
(Continued)

FOREIGN PATENT DOCUMENTS

JP     5-290786 A    11/1993
JP     8-329875 A    12/1996
(Continued)

OTHER PUBLICATIONS

International Search Report (PCT/ISA/210) issued in PCT Application No. PCT/JP2018/046658 dated Feb. 5, 2019 with English translation (four (4) pages).

(Continued)

*Primary Examiner* — Michael Maskell
(74) *Attorney, Agent, or Firm* — Crowell & Moring LLP

(57) ABSTRACT

The objective of the present invention is to use brightness images acquired under different energy conditions to estimate the size of a defect in the depth direction in a simple manner. A charged-particle beam device according to the present invention determines the brightness ratio for each irradiation position on a brightness image while changing parameters varying the signal amount, estimates the position of the defect in the depth direction on the basis of the parameters at which the brightness ratio is at a minimum, and estimates the size of the defect in the depth direction on (Continued)

the basis of the magnitude of the brightness ratio (see FIG. 5).

12 Claims, 9 Drawing Sheets

(58) Field of Classification Search
CPC .. H01J 37/244; H01J 37/224; G01N 23/2251; G01N 23/2255
USPC ................................ 250/306, 307, 310, 311
See application file for complete search history.

(56) References Cited

U.S. PATENT DOCUMENTS

| | | | |
|---|---|---|---|
| 2015/0060666 A1 | 3/2015 | Hatakeyama et al. | |
| 2015/0170875 A1* | 6/2015 | Ban | H01L 22/12 250/310 |
| 2015/0371816 A1* | 12/2015 | Doi | H01J 37/241 250/310 |

FOREIGN PATENT DOCUMENTS

| | | |
|---|---|---|
| JP | 2014-32833 A | 2/2014 |
| TW | 201515046 A | 4/2015 |

OTHER PUBLICATIONS

Japanese-language Written Opinion (PCT/ISA/237) issued in PCT Application No. PCT/JP2018/046658 dated Feb. 5, 2019 (five (5) pages).

Suzuki M. et al., "Secondary Electron Imaging of Embedded Defects in Carbon Nanofiber Via Interconnects", Applied Physics Letters, Dec. 2008, pp. 1-3, vol. 93, Issue 263110, American Institute of Physics (three (3) pages).

Taiwanese-language Office Action issued in Taiwanese Application No. 108103058 dated Oct. 4, 2019 (8 (eight) pages).

* cited by examiner

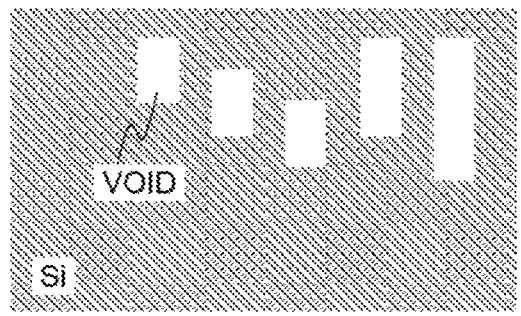
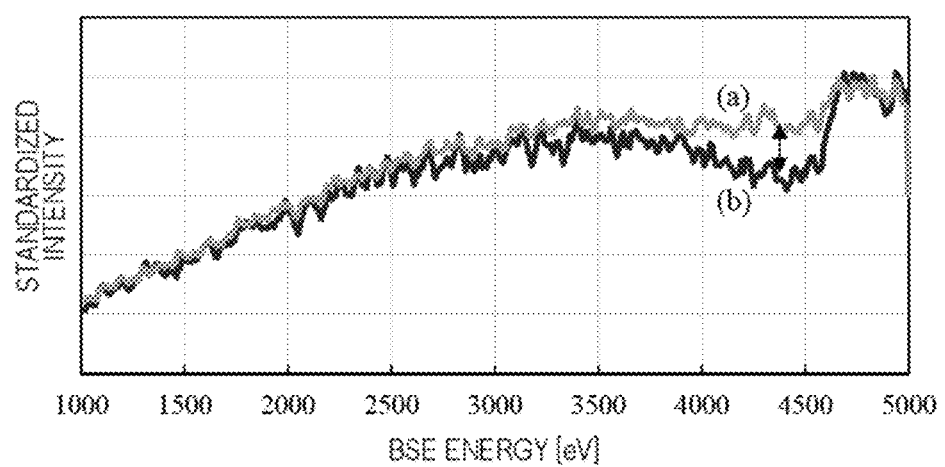
FIG. 4

Line HEIGHT $L_d$ [nm]

| SPACE WIDTH W [nm] | 20 | 50 | 70 | 100 | 130 |
|---|---|---|---|---|---|
| 20 | 1.38E-01 | 1.25E-01 | 1.20E-01 | 1.13E-01 | 1.08E-01 |
| 40 | 1.40E-01 | 1.30E-01 | 1.22E-01 | 1.16E-01 | 1.10E-01 |
| 100 | 1.44E-01 | 1.34E-01 | 1.28E-01 | 1.23E-01 | 1.19E-01 |
| 130 | 1.45E-01 | 1.36E-01 | 1.31E-01 | 1.26E-01 | 1.22E-01 |
| 160 | 1.48E-01 | 1.45E-01 | 1.42E-01 | 1.42E-01 | 1.39E-01 |
| 200 | 1.49E-01 | 1.46E-01 | 1.44E-01 | 1.43E-01 | 1.40E-01 |

*DETECTION RATE (DETECTION/IRRADIATION)

CHARGED-PARTICLE BEAM DEVICE AND CROSS-SECTIONAL SHAPE ESTIMATION PROGRAM

TECHNICAL FIELD

The present invention relates to a charged-particle beam device.

BACKGROUND ART

With the miniaturization and high integration of semiconductor patterns, a slight difference in shape affects operating characteristics of devices, and the need for shape management is increasing. Hence, a scanning electron microscope (SEM) used for inspection and measurement of a semiconductor has been required to have higher sensitivity and higher accuracy than before. In addition to the miniaturization of patterns in recent years, the development of higher aspect ratios in which devices are stacked in the height direction has increased the need for measurement of three-dimensional structures. In addition, with the miniaturization of pattern dimensions, the influence of a void pattern formed in a film formation process on device characteristics increases, and the need for inspection and measurement is increasing. Concerning inspection and measurement of a void and an embedded material formed in a sample, the following methods have been disclosed.

PTL 1 below discloses a method for determining the presence of a void or a foreign substance in a sample by generating a brightness image while changing the energy of an irradiation electron, and measuring a change in brightness value with a change in energy. PTL 2 below discloses a method for estimating the depth of a different material present in a sample from a change in lower-layer information at the time of change in energy of an irradiation electron. NPL 1 below discloses a method for determining a buried void pattern by optimizing the acceleration energy of an electron beam with which irradiation is performed.

CITATION LIST

Patent Literature

PTL 1: JP 2014-032833 A
PTL 2: JP 05-290786 A

Non-Patent Literature

NPL 1: Applied Physics Letters 93, 263110 (2008)

SUMMARY OF INVENTION

Technical Problem

The above related arts determine the presence or absence of a defect (foreign substance, void) in the sample from a plurality of images obtained by performing irradiation with charged-particle beams with respectively different irradiation energies. However, these literatures do not necessarily concretely examine the estimation of the size of the defect in the depth direction.

The present invention has been made in view of the problem as described above, and an object of the present invention is to use brightness images obtained under different energy conditions to estimate the size of a defect in the depth direction in a simple manner.

Solution to Problem

A charged-particle beam device according to the present invention determines a brightness ratio for each irradiation position on a brightness image while changing parameters varying the signal amount, estimates the position of a defect in the depth direction on the basis of the parameters at which the brightness ratio is at a minimum, and estimates the size of the defect in the depth direction on the basis of the magnitude of the brightness ratio.

Advantageous Effects of Invention

According to the charged-particle beam device of the present invention, the position and size of the defect in the depth direction can be estimated from the brightness image. Thereby, the cross-sectional shape of a pattern can be estimated in a simple manner.

BRIEF DESCRIPTION OF DRAWINGS

FIG. 3 is a FIGS. 3A to 3F are side cross-sectional views showing examples of six kinds of sectional structures.

FIG. 4 is a graph showing the results of simulating energy distribution of a backscattered electron (BSE).

DESCRIPTION OF EMBODIMENTS

The need for a scanning electron microscope is increasing as a device for measuring and inspecting a fine pattern of a semiconductor device with high accuracy. The scanning electron microscope is a device for detecting electrons emitted from a sample, generates a signal waveform by detecting such electrons, and measures a dimension between signal waveform peaks (equivalent to edges of the pattern), for example.

In recent years, with the miniaturization of semiconductor devices, device structures have become complex as in FinFET and Nanowire. Accordingly, there is an increasing number of cases where the occurrence of a minute void in the film formation process affects the electrical characteristics of the device, and the importance of void management in process development and mass production has increased. On the other hand, it is difficult to determine a void present inside the sample by using a top-view image obtained by the scanning electron microscope. Therefore, fracture inspection has been adopted, in which the sample is divided and the pattern shape is confirmed using a transmission electron microscope (TEM) and the like. As the device structure becomes more complex, the need to confirm the cross-sectional shape of the pattern increases, and the lengthening of a development period and a cost increase due to the observation of the cross-sectional shape have been problematic.

In the following embodiments, in view of the problems as described above, a description will be given of a method for estimating the position of a void or a foreign substance present in a sample in the depth direction and the size thereof in the depth direction without destroying the sample by using a top-view image of the sample obtained using the scanning electron microscope.

First Embodiment

Figure 1:
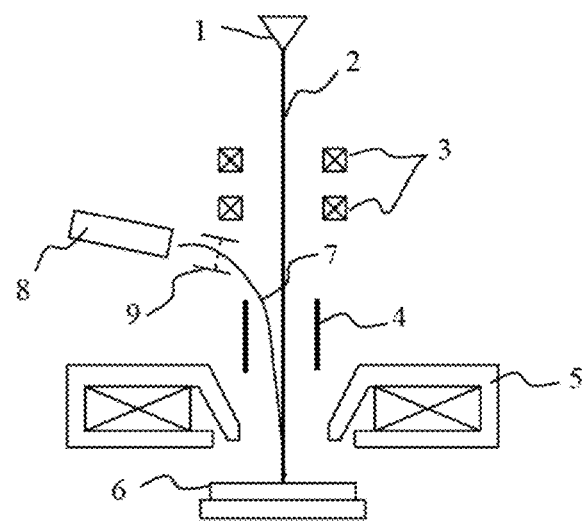
FIG. 1 is a configuration diagram of a charged-particle beam device according to a first embodiment.

FIG. 1 is a configuration diagram of a charged-particle beam device according to a first embodiment of the present invention. The charged-particle beam device according to the present first embodiment is configured as a scanning electron microscope. An electron beam 2 generated from an electron gun 1 is converged by a condenser lens 3 and converged on a sample 6 by an objective lens 5. A deflector 4 (scanning deflector) causes scanning of the surface of the sample 6 by the electron beam 2 (primary electrons) to be performed. By two-dimensionally scanning by the primary electrons to irradiate the sample 6 with the primary electrons, electrons 7 (secondary electrons and backscattered electrons) are emitted from the sample 6. A detector 8 detects the electron 7 and outputs a detection signal indicating its intensity. The sample 6 is observed and measured by converting the detection signal into an image. An energy discriminator 9 (high-pass filter or bandpass filter) is provided at the preceding stage of the detector 8, and the electron 7 detected by the detector 8 is discriminated in accordance with the energy possessed by the electron 7.

The scanning electron microscope of FIG. 1 includes a controller (not shown), and the controller controls each optical element of the scanning electron microscope and controls the discrimination condition of the energy discriminator 9. A negative voltage application power source (not shown) is connected to a sample stage for placing the sample 6. The controller controls the negative voltage application power source to control energy at the time of the electron beam 2 reaching the sample 6. This is not restrictive, and the energy of the electron beam 2 may be controlled by controlling an acceleration power source connected between an acceleration electrode configured to accelerate the electron beam 2 and an electron source. The scanning electron microscope illustrated in FIG. 1 includes an image memory that stores a detection signal for each pixel, and the detection signal is stored into the image memory.

The scanning electron microscope illustrated in FIG. 1 includes arithmetic equipment (not shown). The arithmetic equipment estimates the cross-sectional shape of a pattern on the basis of the image data stored in the image memory. More specifically, for each energy discrimination condition, the position of a defect (void or foreign substance, the same applies hereafter) present inside the sample 6 in the depth direction and the size of the defect in the depth direction are estimated by a method described later on the basis of brightness information stored in each pixel of the image.

Figure 2:
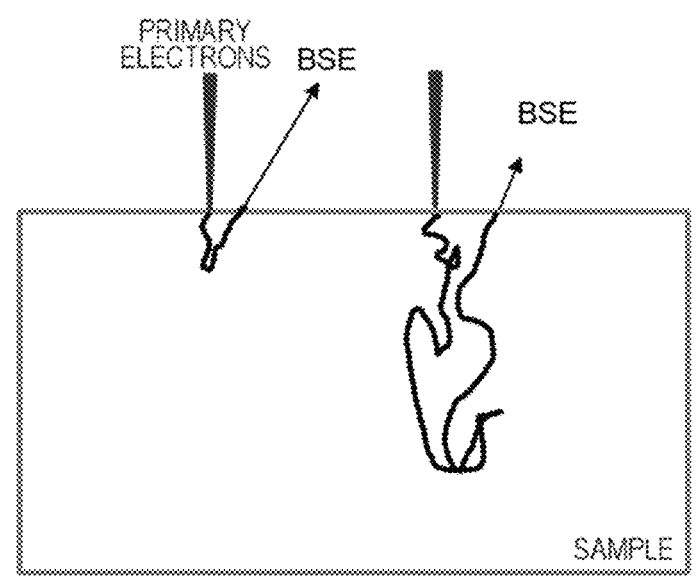
FIG. 2 is a schematic view explaining the relationship between a penetration length and energy of a primary electron with which the sample 6 has been irradiated.

FIG. 2 is a schematic view explaining the relationship between the penetration length and the energy of the primary electron with which the sample 6 has been irradiated. The primary electrons with which the sample 6 has been irradiated are scattered in the sample 6, some remains in the sample 6, and some are emitted from the sample 6 as backscattered electrons (BSEs). At this time, the energy possessed by the BSE differs depending on how much the electron beam has been scattered in the sample 6. The primary electron with which the sample 6 has been irradiated repeats elastic scattering and inelastic scattering and enters the inside of the sample 6. An electron that enters more inside is scattered a larger number of times, so that the probability that the inelastic scattering has occurred increases, and the possibility of occurrence of electron energy loss increases. When the penetration length is short, the opportunity of the energy loss is small because the number of scattering is small, and there is a high possibility of a high-energy BSE. On the other hand, when the electrons enter more inside the sample 6, the probability of the inelastic scattering increases, and the possibility of detecting a low-energy BSE with more energy loss increases.

From the above, the energy possessed by the BSE includes information indicating the penetration length (number of scattering). The higher the energy of the BSE, the energy has information of the structure at a shallower position, and the lower the energy of the BSE, the energy has information of the structure at a deeper position. In the present first embodiment, this characteristic is used to estimate the position of the defect embedded in the sample in the depth direction and the size of the defect in the depth direction.

FIG. 3 is a side cross-sectional view showing examples of six kinds of side cross-sectional structures. Here, five kinds of voids were arranged in a Si sample. In the following description, for convenience, it is assumed that the defect in the sample 6 is a void. Even when the defect is a defect other than a void, it is the same that the change of the brightness ratio is used to estimate the defect position and size.

FIG. 3(a) shows a void-free pattern. In (b) to (d), the sizes of the voids in the z-direction (depth direction) were all set to 40 nm, and the distances from the sample surface were set to 20 nm in (b), 40 nm in (c), and 60 nm in (d). In both (e) and (f), the distance from the sample surface was set to 20 nm, and the sizes of the voids in the z-direction was set to 60 nm in (e) and 80 nm in (f).

FIG. 4 is a graph showing the results of simulating the energy distribution of the BSE. Here, the results of calculating the energy distribution (only in the portion of 1000 eV or more) at the time when the patterns (a) and (b) in FIG. 3 are irradiated with primary electrons of 5 keV by electron beam scattering simulation are shown. According to FIG. 4, a change in signal amount between patterns is observed in a high energy band of 4000 eV to 4500 eV. That is, due to the presence of the void in the sample 6, it can be seen that a difference in the energy distribution of the detected electron has appeared. Hence, it is considered that the depth and size of the void in the sample can be estimated by determining the brightness ratio for each energy possessed by the detected electron.

FIG. 5 is a graph showing the results of simulation in which the brightness ratio is determined for each energy possessed by the detected electron. Even when the acceleration conditions of the electron beam 2 are the same, BSEs having various energies are generated from the sample 6. By setting the discrimination condition of the energy discriminator 9, the detector 8 can be adjusted to detect only the BSE having energy within a certain energy width. In a case where the position or size of the void is determined on the order of 10 nm, the energy width of the detected electron is preferably several tens eV, although depending on the material of the sample 6. The brightness ratio mentioned here is a ratio between a brightness value at a position where the presence or absence of the void is to be determined (a position on the sample surface in the x-y direction) and a brightness value at a reference position except for the position (a position where no void is present inside), for a pixel on the brightness image.

Figure 5A:
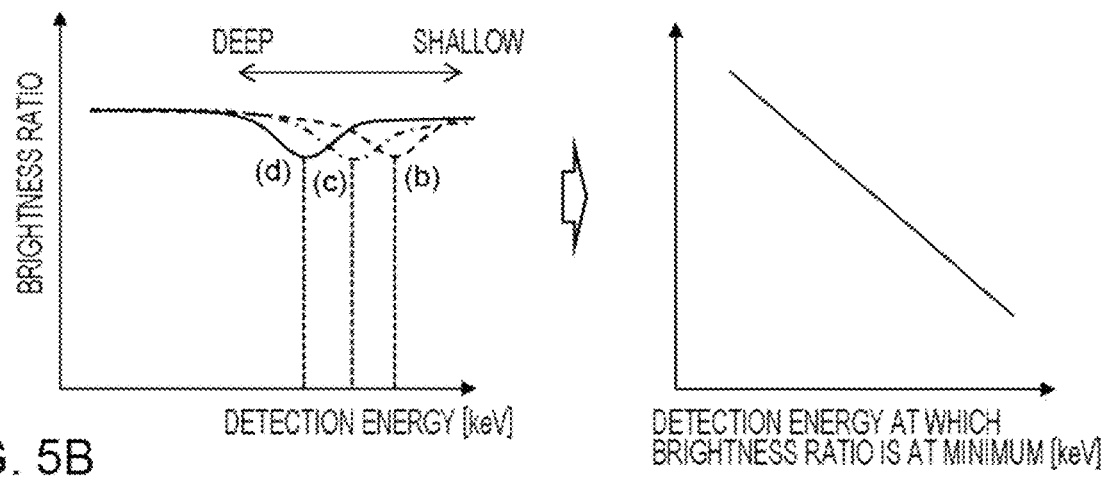
FIGS. 5A and 5B are graphs showing the results of simulation in which a brightness ratio is determined for each energy possessed by a detected electron.

FIG. 5(a) shows the brightness ratios determined for the respective patterns of FIGS. 3 (b), (c), and (d). In the pattern where the void is located deeper, the detection energy, at which the brightness ratio is at a minimum, shifts to the lower energy side. Therefore, the position of the void can be estimated from the detection energy at which the brightness ratio is at a minimum by previously determining the relationship between the detection energy at which the brightness ratio is at a minimum and the void position. The right diagram in FIG. 5(a) is an example of position data describing the relationship.

Figure 5B:
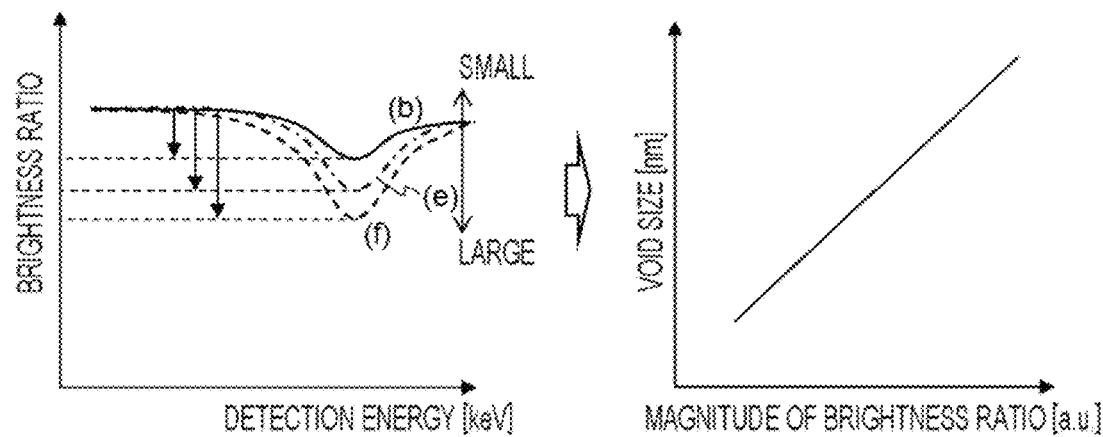

FIG. 5(b) shows the brightness ratios determined for the patterns of FIGS. 3 (b), (e), and (f). In (b), (e), and (f), since the position of the void in the depth direction is the same, the detection energy at which the brightness ratio is at a minimum is the same. On the other hand, the larger the size of the void in the depth direction, the smaller the brightness ratio. Therefore, the void size can be estimated from the magnitude of the brightness ratio by previously determining the relationship between the magnitude of the brightness ratio at which the brightness ratio is at a minimum and the void size. The right diagram in FIG. 5(b) is an example of size data describing the relationship.

From the above, it can be said that the position of the void in the depth direction can be estimated from the detection energy at which the brightness ratio is at a minimum, and that the size of the void in the depth direction can be estimated from the magnitude of the brightness ratio at the time when the brightness ratio is at minimum. The relationship between the detection energy at which the brightness ratio is at a minimum and the void position (position data) and the relationship between the magnitude of the brightness ratio at which the brightness ratio is at a minimum and the void size (size data) may be obtained, for example, by experimenting with a pattern having a known structure, or the results of the electron beam scattering simulation as shown in FIGS. 3 to 4 may be used as a reference.

Figure 6:
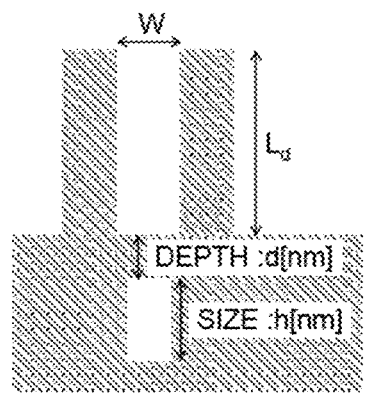
FIG. 6 is an example of a non-flat shape pattern around a void.

FIG. 6 shows an example of a non-flat shape pattern around a void. In the above description, the case where the periphery of the void is flat has been described. In the actual sample 6, there may be a non-flat shape pattern or a different material around the void, and the brightness value may be affected thereby. In this case, the relationship between the peripheral pattern and the influence on the signal amount detected by the detector 8 may be previously described as reference shape data, and the detection result may be corrected in accordance with the description. For example, when the detection rate of the BSE is different in accordance with the peripheral pattern, the correspondence relationship between the peripheral pattern and the detection rate may be described, and the detection result by the detector 8 may be corrected using the correspondence relationship.

As shown in FIG. 6, it is assumed that a void is present below a space portion of a line-and-space pattern. The signal amount from the space portion changes in accordance with a height $L_d$ of the line and a space width W. Here, the detection rate at the time of changing the line height and the space width were changed was determined by simulation to create reference shape data as a lower diagram of FIG. 6. A correction factor (1/detection rate) is multiplied by the detection result (signal amount or brightness value) by the detector 8, so that the influence on the luminance value caused by the peripheral pattern can be corrected.

The reference shape data can be generated, for example, using the results of an electron beam scattering simulation, or the reference shape data can be generated by evaluating the absolute value of the signal amount obtained from each irradiation position on the basis of the experimental results. The processing of correcting the signal amount using the reference shape data can be performed, for example, when a brightness image is generated in step S703 described later.

In addition to or instead of the shape pattern of the sample 6, the reference shape data can also describe the correspondence relationship between the material of the peripheral pattern and the change in signal amount due to the material. In this case as well, when a brightness image is generated in step S703, a signal amount corrected using the reference shape data can be used.

Figure 7:
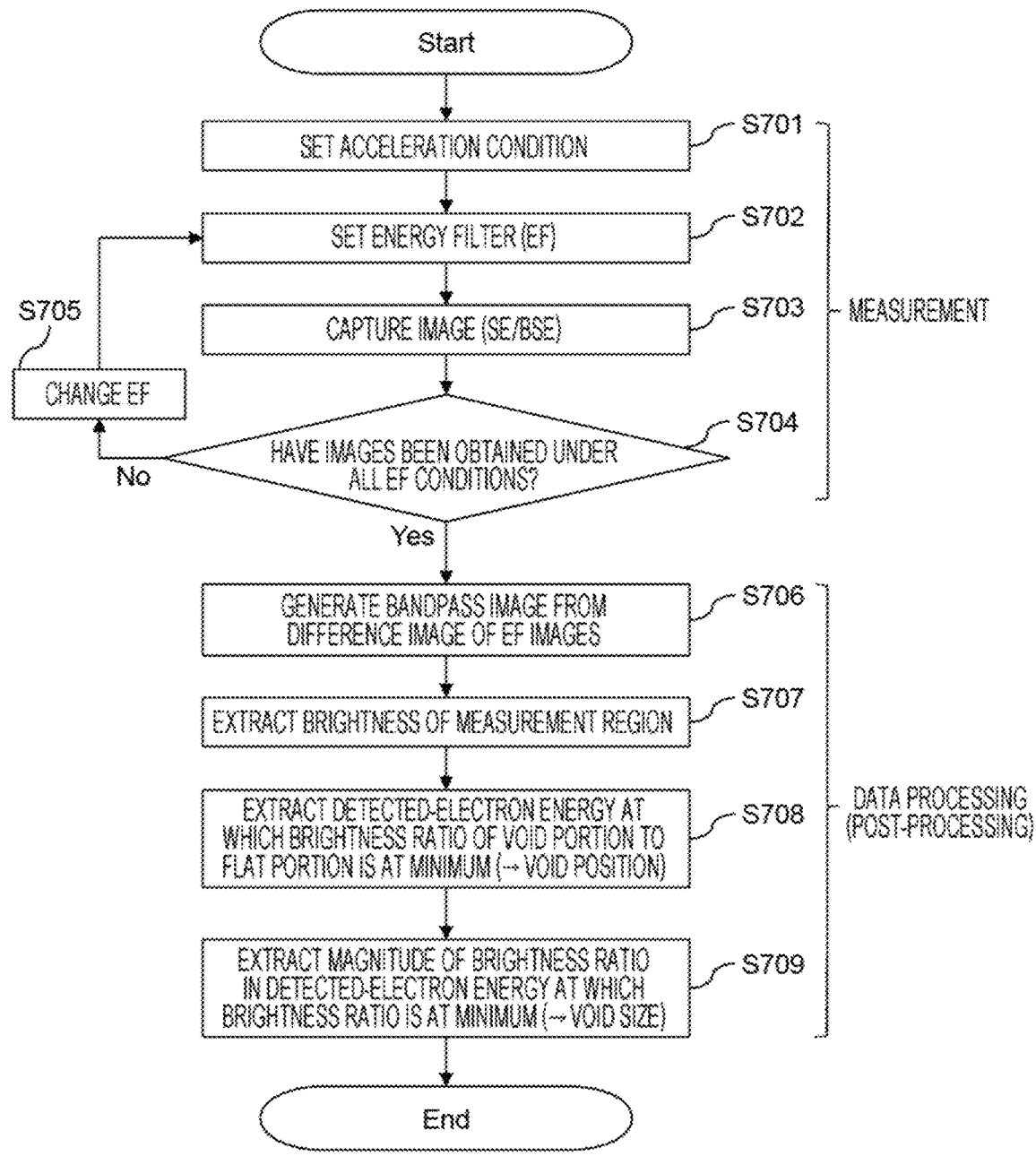
FIG. 7 is a flowchart explaining a procedure for the charged-particle beam device according to the first embodiment to detect a void in the sample 6.

FIG. 7 is a flowchart explaining a procedure for the charged-particle beam device according to the present first embodiment to detect a void in the sample 6. Here, an example will be described where the energy discriminator 9 generates a plurality of brightness images by using an energy filter (high-pass filter, hereinafter described as EF), and generates a brightness image by using the difference images. When the bandpass filter is used instead of the EF, the same is performed except that processing for determining a difference image becomes unnecessary.

(FIG. 7: Step S701)

A user sets the acceleration condition of the electron beam 2. Due to the need for the primary electron beam to reach the void, the acceleration condition is set in consideration of the material and the film thickness of the sample 6. As the acceleration energy is increased, the energy width of the BSE increases and the signal-to-noise (S/N) ratio decreases, and hence the acceleration energy is set so that the penetration length is not excessive while the void depth is covered.

(FIG. 7: Steps S702 to S705)

The user sets the filtering condition of the EF (S702). The arithmetic equipment obtains a BSE brightness image using the detection result by the detector 8 (S703). Steps S702 to S703 are repeatedly performed while the filtering condition is changed (i.e., the detection energy is changed) (S705) until BSE brightness images is obtained under all the filtering conditions (S704).

(FIG. 7: Step S703: Supplement)

When the signal amount is to be corrected using the reference shape data, a secondary electron (SE) is detected in addition to the BSE in step S703, and the arithmetic equipment can specify the peripheral pattern by using the detection result. The signal amount can be corrected by comparing the specified peripheral pattern with the reference shape data. The same applies to FIG. 9 to be described later.

(FIG. 7: Step S706)

The arithmetic equipment generates a bandpass image (difference image) from the two BSE brightness images. For example, the difference image between the brightness images obtained under the EF conditions (−100 V) and the EF conditions (−110 V) is a brightness image generated by detecting an electron having an energy of 100 to 110 eV.

(FIG. 7: Step S707)

The arithmetic equipment extracts a brightness value of a measurement region (a region for determination as to whether there is a void) from the bandpass image generated in step S706. The arithmetic equipment determines the ratio between a brightness value of a flat portion (reference region) and the brightness value of the measurement region.
(FIG. 7: Step S708)

The arithmetic equipment specifies the detected-electron energy at which the brightness ratio is at a minimum. The arithmetic equipment compares the detected-electron energy with the position data (the one described in FIG. 5(a)) to estimate the void position.
(FIG. 7: Step S709)

At the detected-electron energy at which the brightness ratio is at a minimum, the arithmetic equipment compares the magnitude of the brightness ratio when at a minimum with the size data (the one described in FIG. 5(b)) to estimate the void size.

First Embodiment: Summary

The charged-particle beam device according to the present first embodiment generates a brightness image of the sample 6, specifies detected-electron energy at which a brightness ratio between a flat region and a measurement region is at a minimum to estimate a void position, and estimates a void size in accordance with the magnitude of the brightness ratio in the detected-electron energy at which the brightness ratio is at a minimum. As a result, even in a top-view image obtained by the scanning electron microscope, the position and size of a void can be estimated.

Second Embodiment

In the first embodiment, it has been described that the void position and void size are estimated by using the relationship between the detected-electron energy of the BSE and the penetration length of the primary electron. Since the penetration length is changed by changing the acceleration energy of the primary electron, it is considered that the void position and the void size can be estimated similarly. Therefore, in a second embodiment of the present invention, a description will be given of a method for estimating the void position and the void size by changing the acceleration energy of the primary electron instead of the detected-electron energy of the BSE. The structure of the charged-particle beam device is similar to that of the first embodiment.

FIG. 8 is a graph showing the results of simulation in which the brightness ratio is obtained while the acceleration energy of the primary electron is changed. Here, the results of the same electron beam scattering simulation as in FIG. 5 are shown.

Figure 8A:
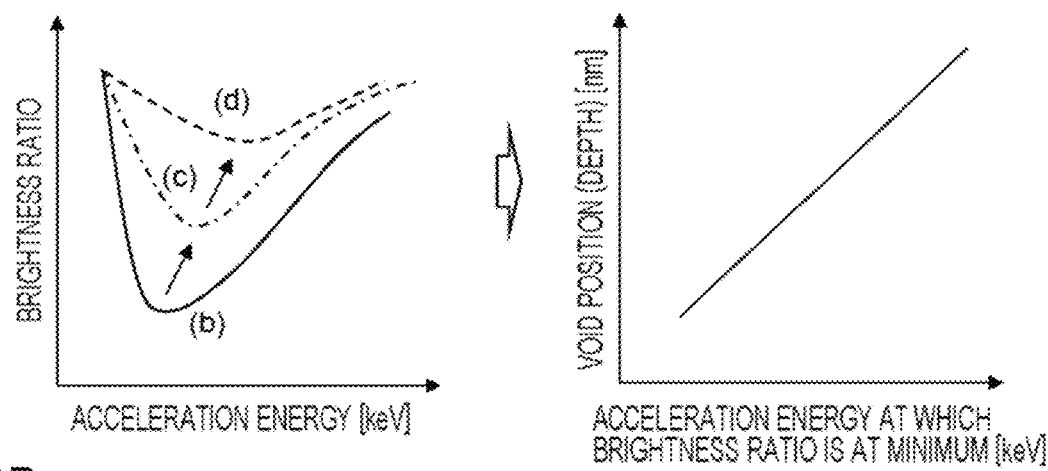
FIGS. 8A and 8B are graphs showing the results of simulation in which a brightness ratio is obtained while the acceleration energy of primary electron is changed.

FIG. 8(a) shows the brightness ratios determined for the respective patterns of FIGS. 3 (b), (c), and (d). In the pattern where the void is located shallower, the acceleration energy, at which the brightness ratio is at a minimum, shifts to the lower energy side. The position of the void can be estimated from the acceleration energy at which the brightness ratio is at a minimum by previously determining the relationship between the acceleration energy at which the brightness ratio is at a minimum and the void position. The right diagram in FIG. 8(a) is an example of position data describing the relationship.

Figure 8B:
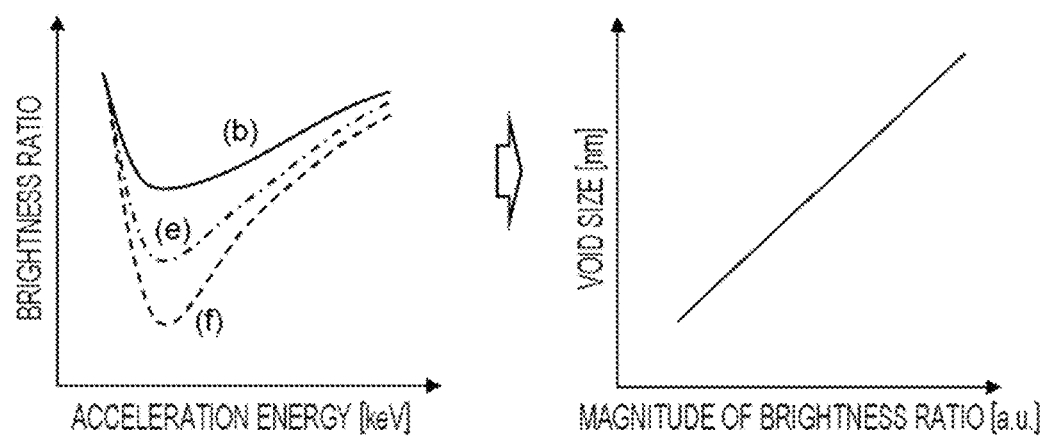

FIG. 8(b) shows the brightness ratios determined for the patterns of FIGS. 3 (b), (e), and (f). In (b), (e), and (f), since the position of the void in the depth direction is the same, the detection energy at which the brightness ratio is at a minimum is the same. On the other hand, the larger the size of the void in the depth direction, the smaller the brightness ratio. Therefore, the void size can be estimated from the magnitude of the brightness ratio by previously determining the relationship between the magnitude of the brightness ratio at which the brightness ratio is at a minimum and the void size. The right diagram in FIG. 8(b) is an example of size data describing the relationship.

Figure 9:
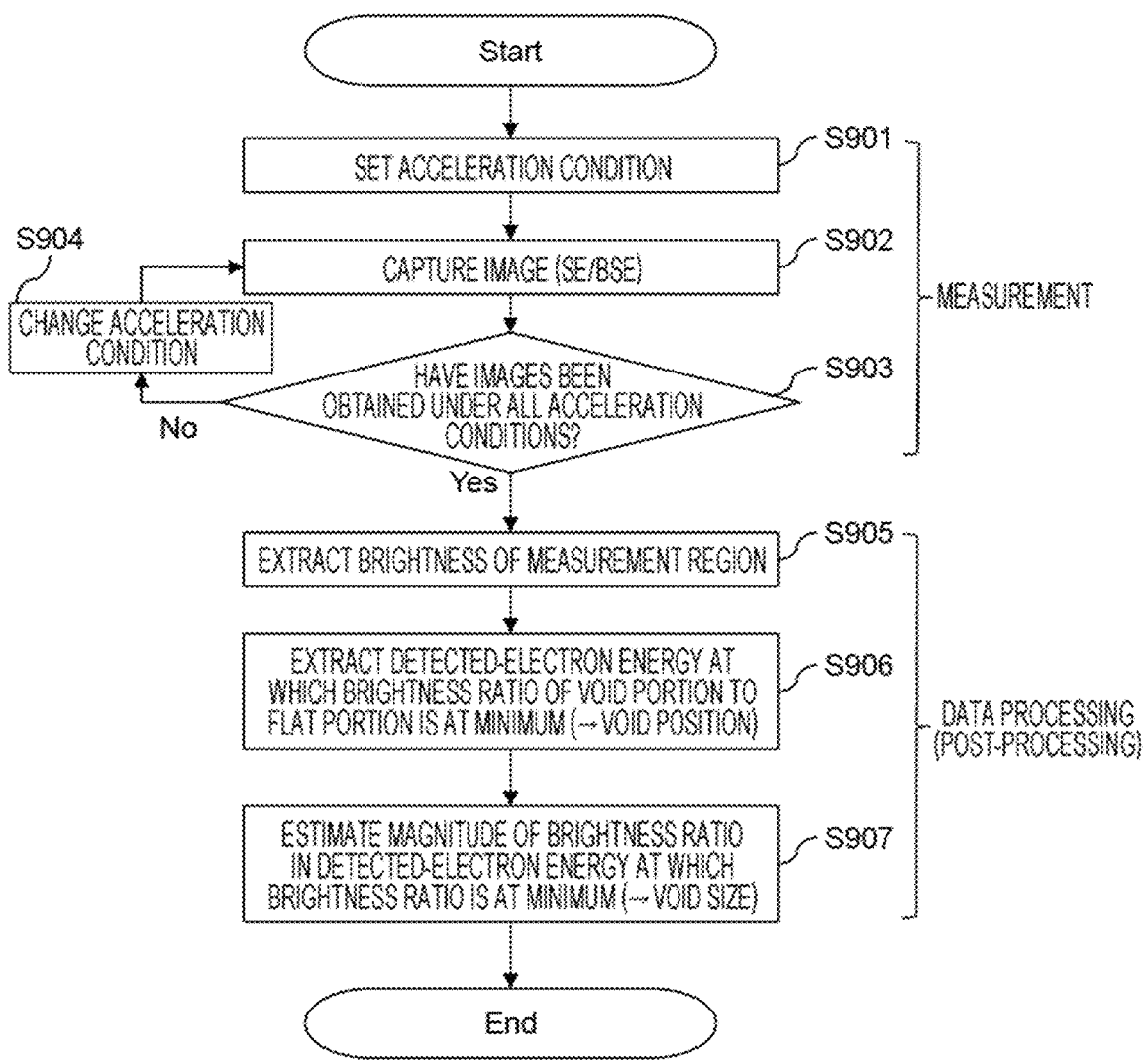
FIG. 9 is a flowchart explaining a procedure for a charged-particle beam device according to a second embodiment to detect a void in a sample 6.

FIG. 9 is a flowchart explaining a procedure for the charged-particle beam device according to the present second embodiment to detect a void in the sample 6. In the present second embodiment, the brightness image is obtained while the acceleration energy of the primary electron is changed, so that it is not necessary to change the energy discrimination condition. Hence, there is no step corresponding to steps S702 and S706.
(FIG. 9: Steps S901 to S904)

The user sets an acceleration condition (acceleration energy) of the electron beam 2 (S901). The arithmetic equipment obtains a BSE brightness image using the detection result by the detector 8 (S902). Step S902 is repeated while the acceleration condition is changed (S904) until brightness images are obtained under all the acceleration conditions (S904). Specifically, all regions of the sample 6 are measured using one acceleration condition, and when the measurement is completed, the measurement shifts to the next acceleration condition.
(FIG. 9: Steps S905 to S907)

The arithmetic equipment extracts the brightness value of the measurement region (S905). The arithmetic equipment compares the acceleration condition under which the brightness ratio is at a minimum with the position data to determine the void position (S906). The arithmetic equipment compares the magnitude of the brightness ratio at which the brightness ratio is at a minimum with the size data to determine the void size (S907).

Second Embodiment: Summary

The charged-particle beam device according to the present second embodiment uses the acceleration energy instead of the detection energy to estimate the void position and the void size. As a result, a similar effect to that in the first embodiment can be achieved without performing the processing for calculating a difference image.

Third Embodiment

Figure 10:
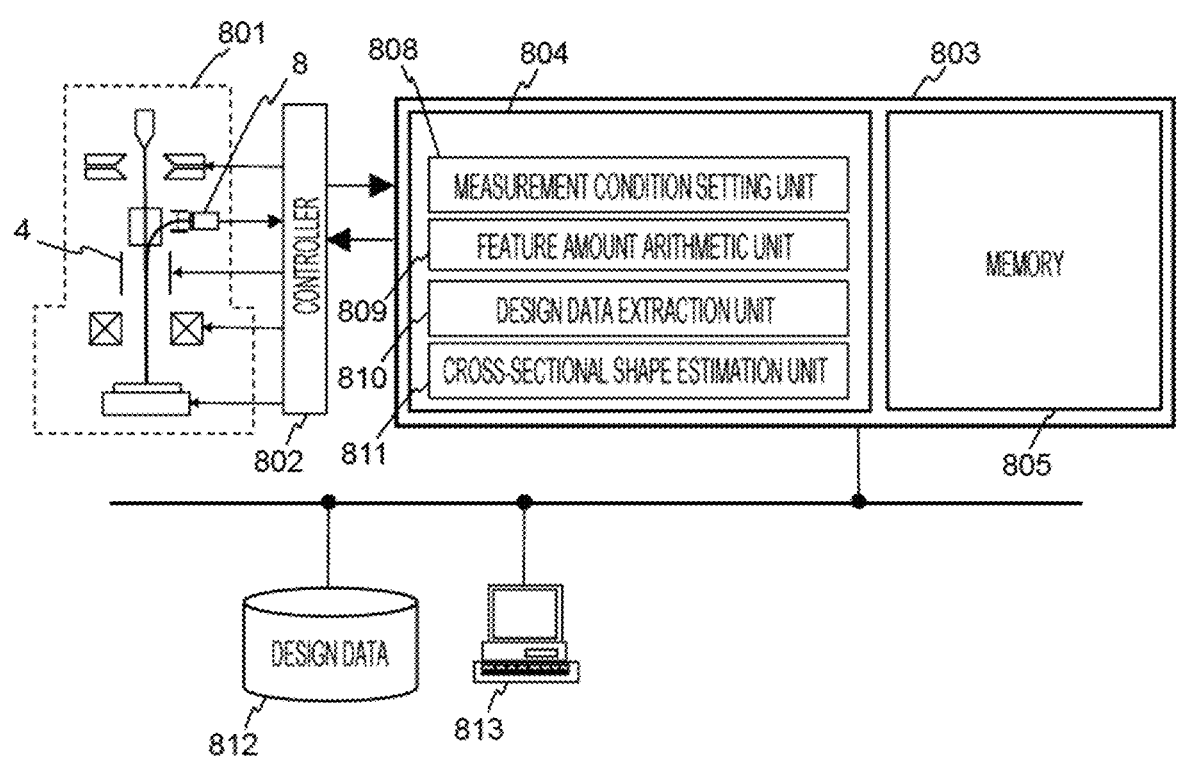
FIG. 10 is a configuration diagram of a cross-sectional shape estimation system according to a third embodiment.

FIG. 10 is a configuration diagram of a cross-sectional shape estimation system according to a third embodiment of the present invention. A controller for a scanning electron microscope includes: (a) a function of controlling each unit of the scanning electron microscope; (b) a function of forming an observation image of the sample 6 on the basis of the detected electron 7; (c) a function of deriving an edge position of a pattern from each image; (d) a function of deriving an amount of change in edge position among a plurality of images; and some other function. A part or all of the arithmetic processing of these functions may be performed by arithmetic equipment provided separately from the controller. In the present third embodiment, a description will be given of a configuration example in which an arithmetic processor 803 to be described later performs the arithmetic processing.

The cross-sectional shape estimation system of FIG. 10 includes a SEM body 801, a controller 802, and an arithmetic processor 803. The SEM body 801 is a charged-particle beam device according to the first and second embodiments. The arithmetic processor 803 includes an arithmetic processing unit 804 and a memory 805. The arithmetic processing unit 804 supplies a predetermined control signal to the controller 802 and processes a signal obtained by the SEM body 801. The memory 805 stores obtained image data, a recipe (data describing measurement conditions and the like), position data/size data/reference shape data described in the first and second embodiments, and the like. The controller 802 and the arithmetic processor 803 may be constituted integrally.

The deflector 4 causes scanning by the electron beam 2 to be performed. The detector 8 captures the electrons 7 emitted from the sample 6. An analog-to-digital converter built in the controller 802 converts the detection signal output from the detector 8 into a digital signal. The arithmetic processor 803 includes arithmetic processing hardware such as a central processing unit (CPU), and realizes each function by arithmetic processing of a detection signal by the hardware.

The arithmetic processing unit 804 includes a measurement condition setting unit 808, a feature amount arithmetic unit 809, a design data extraction unit 810, and a cross-sectional shape estimation unit 811. The measurement condition setting unit 808 sets measurement conditions such as a scanning condition of the deflector 4 on the basis of the measurement conditions and the like input by the inputter 813. The feature amount arithmetic unit 809 determines from the image data a profile in a region of interest (ROI) input by the inputter 813. The design data extraction unit 810 reads design data from a design data storage medium 812 in accordance with the conditions input by an inputter 813, and converts vector data into layout data as necessary. The cross-sectional shape estimation unit 811 uses each brightness image determined by the feature amount arithmetic unit 809 to estimate the cross-sectional shape of the sample 6 by the method described in the first and second embodiments.

Figure 11:
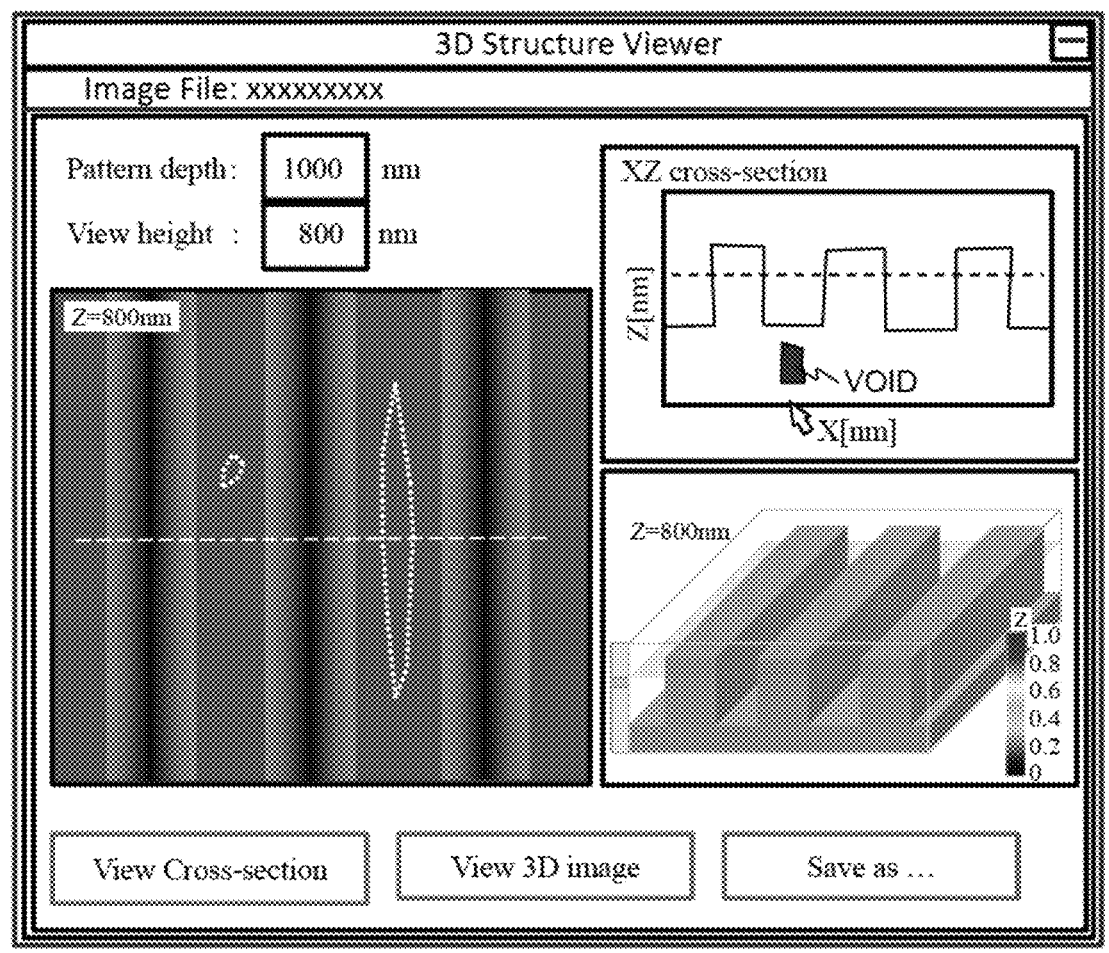
FIG. 11 is an example of a graphical user interface (GUI) displayed by an inputter 813.

The inputter 813 is connected to the arithmetic processor 803 via a network and provides an operator with a graphical user interface (GUI) that displays an observation image of the sample 6, an estimated result of the cross-sectional shape, and the like (FIG. 11 to be described later). For example, the image data and the design data can be displayed together as a three-dimensional map.

FIG. 11 is an example of the GUI displayed by the inputter 813. The operator sets the pattern depth of the image. The operator can also view an XY cross-sectional image at any depth by specifying a cross-section height (view height) as viewed from the bottom of the sample.

FIG. 11 shows an SEM image (top view) on the left side. A void or a foreign substance in the sample 6 is displayed as an area surrounded by a dotted line. The difference between a void and a foreign substance is distinguished by the color of display (e.g., void: red, foreign substance: yellow, etc., which can be specified by the operator). The lower right of FIG. 11 is a three-dimensional image of the sample 6. The lower right three-dimensional image can be arbitrarily rotated by a mouse pointer. The cross-section height (view height) can also be specified from the lower right three-dimensional image in the figure. The specified height is reflected in the XY cross-sectional image (FIG. 11 Left). When the XZ cross-section or the YZ cross-section is set (white dashed line) in the XY cross-sectional image, the estimated cross-sectional shape in the cross section is displayed on the upper right in FIG. 11. The cross-sectional shape also displays information of a void and a foreign substances present in the sample, and the like. The created image and cross-sectional shape can be named and saved.

As a method for classifying the types of defects in the sample 6, for example, the following method can be considered. Metal generally produces more secondary electrons (SEs) and BSEs than a Si sample, and hence a brightness value of a region where a metal defect is present is greater than the brightness value of the reference region. Therefore, unlike FIG. 4(*b*), the signal intensity is larger than that at the reference region. When the defect is a void, a similar result to that in FIG. 4(*b*) is obtained. Using these principles, the arithmetic equipment can classify whether the defect is metal or a void. These principles rely on the relative relationship between the incidence of the SE to the BSE in the Sample 6 and the incidence of the SE to the BSE in the defective material. Therefore, the arithmetic equipment can classify the defect type in accordance with the relative relationship.

Modifications of the Present Invention

The present invention is not limited to the above embodiments but include various modifications. For example, the above embodiments have been described in detail for the purpose of describing the present invention in an easy-to-understand manner and are not necessarily limited to those having all the configurations described above. It is also possible to replace a part of the configuration of one embodiment with the configuration of another embodiment, or to add the configuration of another embodiment to the configuration of one embodiment. It is also possible to add, delete, or replace a part of the configuration of each embodiment with another configuration.

In the first embodiment, the void position and the void size have been estimated using the brightness ratio, but the difference between the brightness value at the reference region and the brightness value at the measurement region can be used instead of the brightness ratio. Since the brightness ratio and the brightness difference are obtained by the comparison of the brightness, these are only different in expression and can be said to be substantially the similar processing.

In the above embodiments, the example of using the detection energy of the BSE to detect the defect and the example of using the acceleration energy to detect the defect have been described. It is necessary to set the discrimination condition of the energy discriminator 9 in order to specify the detection energy, and it is necessary to set the acceleration condition in order to specify the acceleration energy. These can be said to be parameters that vary the signal amount detected by the detector 8 to cause a change in the brightness ratio on the brightness image. When another parameter has the equivalent effect to the above parameters, it is also conceivable to change another parameter to cause a change in brightness ratio and to apply a method similar to the present invention.

The reference shape data can be defined for each peripheral pattern. For example, when a shape pattern other than that illustrated in FIG. 6 is present, reference shape data can be separately defined for the shape pattern.

As an example of the reference shape data, the line height and the space width have been illustrated, but another parameter considered to affect the brightness value, such as a line width or a line material, can also be described as the reference shape data. The detection rate has been illustrated as an example of the reference shape data, but another parameter that can correct the influence of the peripheral pattern on the brightness value can also be described.

Each of the processing described in the first and second embodiments may be performed on arithmetic equipment (e.g., controller 802) provided in the charged-particle beam device itself, or the charged-particle beam device itself may obtain only a detection signal, and another arithmetic equipment (e.g., arithmetic processor 803) may obtain data describing the detection signal and perform the same processing. The processing to be performed by each arithmetic equipment may be performed by using hardware such as a circuit device mounted with the arithmetic processing, or may be performed by the arithmetic equipment executing software mounted with the arithmetic processing.

REFERENCE SIGNS LIST 1 electron gun
2 electron beam
3 condenser lens
4 deflector
5 objective lens
6 sample
7 electron
8 detector
801 SEM body
802 controller
803 arithmetic processor
804 arithmetic processing unit
805 memory
808 measurement condition setting unit
809 feature amount arithmetic unit
810 design data extraction unit
811 cross-sectional shape estimation unit
812 design data storage medium
813 inputter

The invention claimed is:

1. A charged-particle beam device for irradiating a sample with a charged-particle beam, the device comprising:
   a charged particle source that emits the charged-particle beam;
   a detector that detects a charged particle generated by irradiating the sample with the charged-particle beam, and outputs a detection signal indicating intensity of the charged particle;
   an energy discriminator that discriminates the charged particle in accordance with energy possessed by the charged particle before the detector detects the charged particle; and
   an arithmetic element that uses the detection signal output by the detector to generate a brightness image of the sample,
   wherein the arithmetic element generates the brightness image having a pixel corresponding to an irradiation position of the charged particle and having a brightness value corresponding to the detection signal at the irradiation position,
   the arithmetic element determines a brightness ratio between the irradiation position and a reference position on the sample when the brightness value at the irradiation position changes from a brightness value at the reference position,
   the arithmetic element generates the brightness image while changing a parameter varying a signal amount at a time of detection of the charged particle, and specifies the parameter at which the brightness ratio is at a minimum to determine a position of a defect inside the sample in a depth direction, and
   the arithmetic element determines a size of the defect in the depth direction in accordance with magnitude of the brightness ratio.

2. The charged-particle beam device according to claim 1, further comprising a storage unit that stores position data describing a correspondence relationship between the parameter at which the brightness ratio is at a minimum and the position of the defect in the depth direction,
   wherein the storage unit further stores size data describing a correspondence relationship between the magnitude of the brightness ratio and the size of the defect in the depth direction, and
   the arithmetic element uses the position data and the size data to determine the position of the defect in the depth direction and the size of the defect in the depth direction.

3. The charged-particle beam device according to claim 1, further comprising a storage unit that stores reference shape data describing at least one of a correspondence relationship between a shape pattern of the sample and an amount of change in the detection signal due to the shape pattern and a correspondence relationship between a material of the sample and an amount of change in the detection signal due to the material,
   wherein the arithmetic element refers to the reference shape data to correct the detection signal in accordance with the shape pattern of the sample or the material of the sample, and then generates the brightness image.

4. The charged-particle beam device according to claim 1, wherein
   the arithmetic element changes a discrimination condition of the energy discriminator and changes energy of the charged particle detected by the detector to change the parameter, and
   the arithmetic element determines the brightness ratio for each energy of the charged particle detected by the detector.

5. The charged-particle beam device according to claim 1, wherein
   the arithmetic element changes an acceleration voltage at a time of emission of the charged-particle beam by the charged particle source to change the parameter, and
   the arithmetic element determines the brightness ratio for each value of the acceleration voltage.

6. The charged-particle beam device according to claim 1, wherein
   the energy discriminator is configured using a bandpass filter, and
   the arithmetic element sets the bandpass filter so that the charged particle having energy corresponding to the parameter passes through the energy discriminator.

7. The charged-particle beam device according to claim 1, wherein
   the energy discriminator is configured using a high-pass filter, and
   the arithmetic element sets a plurality of filtering conditions of the high-pass filter, determines the brightness value for each of the filtering conditions, and determines a difference between the respective brightness values to generate the brightness image.

8. The charged-particle beam device according to claim 1, wherein the arithmetic element compares a reference incidence of the charged particle generated from the sample with an incidence of the charged particle at a time of irradiation of the irradiation position with the charged-particle beam, to estimate a type of the defect.

9. The charged-particle beam device according to claim 1, wherein
the arithmetic element generates an image representing a cross-sectional shape of the sample, and
the charged-particle beam device further comprises a display that displays an image of the cross-sectional shape of the sample.

10. The charged-particle beam device according to claim 9, wherein
the arithmetic element estimates the cross-sectional shape of the sample for each position of the sample in the depth direction to estimate a three-dimensional shape of the sample, and
the display displays the three-dimensional shape of the sample estimated by the arithmetic element.

11. The charged-particle beam device according to claim 8, further comprising a display that displays a result of the estimation by the arithmetic element.

12. A non-transitory computer-readable medium storing a cross-sectional shape estimation program for causing a computer to execute processing of estimating a cross-sectional shape of a sample, the program comprising:

a step of obtaining detection signal data that describes a detection signal indicating intensity of a charged particle generated by irradiating the sample with a charged-particle beam; and
an arithmetic step of using the detection signal data to generate a brightness image of the sample,
wherein in the arithmetic step, a brightness image, having a pixel corresponding to an irradiation position of the charged particle and having a brightness value corresponding to the detection signal at the irradiation position, is generated,
in the arithmetic step, a brightness ratio between the irradiation position and a reference position on the sample is determined when the brightness value at the irradiation position changes from a brightness value at the reference position,
in the arithmetic step, the brightness image is generated while a parameter varying a signal amount at a time of detection of the charged particle is changed, and the parameter at which the brightness ratio is at a minimum is specified to determine a position of a defect inside the sample in a depth direction, and
in the arithmetic step, a size of the defect in the depth direction is determined in accordance with magnitude of the brightness ratio before and after the change.

* * * * *